(12) United States Patent
Larson

(10) Patent No.: US 6,339,875 B1
(45) Date of Patent: Jan. 22, 2002

(54) METHOD FOR REMOVING HEAT FROM AN INTEGRATED CIRCUIT

(75) Inventor: Ralph I. Larson, Bolton, MA (US)

(73) Assignee: Heat Technology, Inc., Sterling, MA (US)

( * ) Notice: Subject to any disclaimer, the term of this patent is extended or adjusted under 35 U.S.C. 154(b) by 0 days.

(21) Appl. No.: 09/521,745

(22) Filed: Mar. 9, 2000

Related U.S. Application Data

(63) Continuation-in-part of application No. 08/834,949, filed on Apr. 7, 1997.
(60) Provisional application No. 60/015,001, filed on Apr. 8, 1996.

(51) Int. Cl.⁷ ................................................. H05K 3/30
(52) U.S. Cl. ............................. 29/841; 29/840; 29/832; 29/740
(58) Field of Search .......................... 29/832, 825, 840, 29/740, 841

(56) References Cited

U.S. PATENT DOCUMENTS

| 4,548,862 | A |   | 10/1985 | Hartman |
|---|---|---|---|---|
| 4,654,966 | A | * | 4/1987 | Kohara et al. |
| 5,168,926 | A | * | 12/1992 | Watson et al. |
| 5,296,740 | A |   | 3/1994 | Sono et al. |
| 5,328,087 | A |   | 7/1994 | Nelson et al. |
| 5,358,032 | A |   | 10/1994 | Arai et al. |
| 5,360,942 | A |   | 11/1994 | Hoffman et al. |
| 5,421,406 | A |   | 6/1995 | Furusawa et al. |
| 5,471,366 | A | * | 11/1995 | Ozawa |
| 5,488,254 | A |   | 1/1996 | Nishimura et al. |
| 5,592,735 | A | * | 1/1997 | Ozawa et al. .................. 29/846 |
| 5,625,229 | A |   | 4/1997 | Kojima et al. |
| 5,665,473 | A |   | 9/1997 | Okoshi et al. |
| 5,744,863 | A |   | 4/1998 | Culnane et al. |
| 5,773,362 | A | * | 6/1998 | Tonti et al. |
| 6,084,775 | A | * | 7/2000 | Bartley et al. |

* cited by examiner

Primary Examiner—Carl J. Arbes
(74) Attorney, Agent, or Firm—Daly, Crowley & Mofford, LLP

(57) ABSTRACT

A heatsink interface material for securing a heatsink to an integrated circuit includes a core material having an adhesive forced into opposing surfaces of the core material. It is preferred that an intermediate region of the core material be free of adhesive. In one embodiment, copper is deposited on the first and second surfaces of the core material and then nickel is deposited on the first and second surfaces. An exemplary method for fabricating a heatsink interface material in accordance with the present invention can include applying heat and pressure to force adhesive into the core material. Copper and nickel can be deposited on the core material surfaces using electroless deposition techniques.

22 Claims, 12 Drawing Sheets

METHOD FOR REMOVING HEAT FROM AN INTEGRATED CIRCUIT

CROSS REFERENCE TO RELATED APPLICATION

This application is a continuation-in-part of U.S. Application No. 08/834,949 filed on Apr. 7, 1997, which claims priority from U.S. Provisional Application No. 60/015,001 filed on Apr. 8, 1996, both of which are incorporated by reference in their entirety.

STATEMENT REGARDING FEDERALLY SPONSORED RESEARCH

Not Applicable.

FIELD OF THE INVENTION

The present invention relates generally to heatsinks, and more particularly, to materials for securing heatsinks to integrated circuits (ICs).

BACKGROUND OF THE INVENTION

As is known in the art, integrated circuits may be manufactured using a so-called encapsulation process in which an integrated circuit chip or die (i.e. an unpackaged functional element manufactured by subdividing a wafer of semiconductor material) is packaged for mounting and/or protective purposes. During the encapsulation process, a lead frame is disposed in a lead frame holder. A body of the lead frame has projecting therefrom a plurality of pins which form the electrical contact points of a complete integrated circuit. One or more dies may be disposed on a flag portion of the lead frame and wires are bonded to the die(s) and to corresponding ones of the lead frame pins to thus provide a lead frame assembly.

The lead frame assembly is disposed in a mold. An encapsulating material such as plastic, for example, is injected into the mold to enclose the lead frame assembly including the semiconductor die. The resultant package thus corresponds to an encapsulated integrated circuit.

The pins project through the encapsulating housing and thus provide electrical connection points for the integrated circuit. The encapsulating material is proximate to and often physically contacts the semiconductor die.

As is also known, there is a trend to reduce the size of semiconductor devices, integrated circuits and microcircuit modules while having the devices, circuits and modules perform more functions. As a result of the increased functionality, such devices, circuits and modules thus use increasingly more power than heretofore. Such power is typically dissipated as heat generated by the devices, circuits and modules.

This increased heat generation coupled with the need for devices, circuits and modules having relatively small sizes has led to an increase in the amount of heat which must be transferred away from the devices in order to prevent the devices, circuits and modules from becoming destroyed due to exposure to excessive heat. Such devices circuits and modules, are presently limited with respect to the amount of the self-generated heat which they can successfully expel and prevent from building up as they are caused to operate at higher powers.

The proximity of the semiconductor die and the encapsulating housing results in a path between the die and the housing through which heat flows from the semiconductor die to the housing. Heat paths also exist through the bond wires which lead from the semiconductor dies to the pins of the integrated circuit device, however, such heat paths are relatively ineffective due to the relatively small size of the bond wires which are typically provided having a diameter in the range of 0.001 to 0.005 inch. Thus, in most cases it is desirable to extract heat through the surface of the encapsulating housing of the integrated circuit.

The encapsulating material has a mold release characteristic which prevents the encapsulating material from adhering to the mold and thus allows the complete integrated circuit to be separated from the mold in a relatively easy manner and without causing damage to any portion of the integrated circuit. One problem with such encapsulating material, however, is that the mold release characteristic of the encapsulating material prevents other circuit components from adhering to the integrated circuit housing. Thus it is relatively difficult to reliably attach a heatsink to the encapsulating material of the integrated circuit package.

One approach to attaching heatsinks, therefore, has been to mechanically attach the heatsink with a clamp for example. In this approach, a thermal grease or oil is applied to the heatsink, for example, and the heatsink is then placed on the integrated circuit package. A clamp is then used to secure the heatsink to the integrated circuit. One problem with this approach, however, is that the clamps take up space on the printed circuit board to which the clamp is attached. Furthermore, it is relatively time consuming to attach heatsinks to integrated circuits using such clamps.

Moreover, the clamp generates a relatively large compression force between the IC package and the heatsink. The compression force can thus bend and/or distort both the heatsink and the IC package thereby damaging either one or both of the heatsink and IC.

Also, it is relatively difficult to interface such a clamp to an IC package because the clamp attachment points represent areas of very high local stress. If the IC package is plastic, the clamp can locally deform, or even crack the plastic.

Furthermore, the electrical pins of the IC are often located in the regions most desirable for mechanical clamp attachment means. Thus, a relatively complex clamp is often required to properly secure the heatsink to the IC.

Another approach for adhering a heatsink to an IC is to use double sided tape to secure the heatsink to a surface of the integrated circuit. In this approach, a first surface of a strip of double sided tape is placed on the integrated circuit and a second surface of the double sided tape is left exposed. A heatsink is placed on the integrated circuit with at least a portion of the heatsink attached to the second surface of the double sided tape. In this manner the heatsink can be attached to the integrated circuit. One problem with each of these approaches, however, is that due to heating of the integrated circuit, the tape tends to separate from either the integrated circuit package or the heatsink. Thus the heatsink can separate from or fall off the integrated circuit.

In some instances, the environments in which the devices, circuits and modules are used permit complex forced-fluid cooling systems to be employed. Such forced-fluid cooling systems while effective for cooling the devices, circuits and modules are relatively expensive and bulky and require a relatively large amount of space.

Another more economical approach involves the attachment of relatively simple heatsinks having fins provided by metal extrusion or stamping techniques. Such finned heatsinks help to conduct and radiate heat away from the thermally vulnerable regions of the integrated circuit component. For such purposes, it is important that the thermal impedance between a semiconductor or microcircuit device and its associated heatsink structure be kept to a minimum and that it be of uniformity which will prevent build-up of localized hot spots on the device, circuit or module. Such characteristics are not always realized to a satisfactory extent by simply abutting some part of the heat-generating unit with complementary surfaces of its heatsink because, despite appearances, the respective mating surfaces of the heat-generating unit and heatsink will generally have only a relatively small percentage of surface area in actual physical contact.

Such limited contact between a heatsink and an IC component and the attendant poor transmission of heat is due, at least in part, to relatively gross imperfections in the contacting surfaces of the heatsinks and the devices, circuits and modules with which the heatsinks are used. The contact area may be increased somewhat by machining the mating surfaces of the heatsink and the device, circuit or module to relatively precise tolerances. Alternatively, other surface shaping techniques may also be used.

The contact area may also be enlarged by tightly clamping together the heatsink and the device circuit or module. A relatively large clamping force between the heatsink and IC forces irregular surfaces of the heatsink into contact with irregular surfaces of the IC and thus can improve heat transfer characteristics between the heatsink and IC, but the effect is non-linear with a fractional exponent. Thus relatively large increases in force are needed to achieve small improvements in thermal transfer characteristics. As mentioned above, exposure to such large clamp forces can damage the heatsink and/or the IC.

Small surface contact areas can also be attributed, at least in part, to microscopic surface rregularities, which will remain at the interface between a heatsink and a device, circuit or module even if the cooperating parts are formed and finished with great care. When it becomes necessary to electrically insulate one part from another, the heat conduction problems are greatly compounded.

Also among the prior practices which have been employed in efforts to improve the heat flow from semiconductor or like devices to their heatsinks is that of spreading amorphous oil or grease, such as silicon, between the joined surfaces. The messy character of such a filler, as well as the use of insulating mica and varnish insulating layers, are referred to in U.S. Pat. No. 3,29,757 . Thermal grease and/or powdered metal, contained by a film, has likewise been proposed to augment heat transfer, in U.S. Pat. No. 4,092, 697 , although the fabrication and handling of such small "pillows" obviously involves special problems also. Cooling fins have been secured by means of epoxy cement loaded with powdered metal (U.S. Pat. No. 3,261,396), and large-area epoxy films have been said to insulate while yet transferring large quantities of heat (U.S. Pat. No. 3,611, 046). In U. S. Pat. No. Re. 25,184 , electrically non-conductive plastic coating material is filled with molybdenum disulfide to promote heat conduction, and, where electrical insulation is not essential, a dimpled malleable metal wafer has been interposed to increase transfer of heat (U.S. Pat. No. 4,151,547).

It would, therefore, be desirable to provide a reliable, relatively low-cost technique for removing heat from an integrated circuit. It would also be desirable to provide a technique for reliably mounting a heatsink to an integrated circuit.

SUMMARY OF THE INVENTION

In accordance with the present invention, a heatsink assembly includes a heatsink having first and second opposing surfaces with a thermally conductive matrix material disposed over at least a portion of the first surface thereof. With this particular arrangement, a heatsink assembly which may be securely and reliably coupled to a housing of an integrated circuit is provided. The conductive matrix material may be provided having a continuous electrically and thermally conductive scaffold matrix shape which provides a thermal path through an adhesive. The adhesive allows the thermally conductive matrix material to be bonded to the heatsink to thus provide a heatsink assembly which can be adhered to an integrated circuit housing. In a preferred embodiment the heatsink is provided from a Aluminum Silicon Carbide material and a first surface of the heatsink has a plurality of pin or fin shaped structures projecting therefrom. A second surface of the heatsink is provided having a shape which is complementary to that portion of the heat generating device to which the heatsink is to be adhered. For example if the heat generating device corresponds to an integrated circuit component, then the second surface of the heatsink is provided having a surface topology which is complementary to that portion of the integrated circuit housing to which the heatsink is to be adhered. Furthermore, the heatsink and thermally conductive matrix material may be provided having a shape which matches the shape of the portion of the integrated circuit housing to which the heatsink is to be adhered. In a preferred embodiment the thermally conductive matrix material is provided as a type known as W. L. Gore, Inc. and identified as Gore-Bond MG or that shown in FIGS. 9–13. Typically, it is desired to provide the thermally conductive matrix having a thickness which is as thin as possible to thereby minimize the temperature difference between the heatsink and the silicon die of the integrated circuit component.

In a further embodiment of the invention, a heatsink assembly includes a folded fin member bonded by a thermally conductive matrix material to a plate. In a preferred embodiment, the folded fin member and plate are formed from aluminum so that both the folded fin member and the plate have the same thermal expansion characteristics to reduce stress between these components. This particular arrangement advantageously allows a relatively thin folded fin member to be in thermal communication with the plate to provide a heatsink assembly having a low pressure drop with respect to air flow through the assembly. This heatsink assembly may bonded to an integrated circuit with the same or different thermally conductive material.

In accordance with a further aspect of the present invention, a method for adhering a heatsink to an integrated circuit includes the steps of applying a thermally conductive matrix material to a first one of a first surface of a heatsink or a first surface of an integrated circuit housing and mating the surface having the matrix material disposed thereon to a second one of the first surface of the heatsink and the first surface of the integrated circuit housing. It is desirable to ensure flatness of the first surface of the heatsink, for example by lapping, and to clean the surfaces to be mated to remove grease, oil, or gross contaminants to the maximum extent possible. Cleansing of the surface of the IC may be accomplished with denatured alcohol or acetone, for example. The surface of the heatsink may be cleaned with a mild caustic etch and warm water rinse. It should be noted, however, that other cleaning techniques may also be used and that the particular cleaning materials and techniques should be selected in accordance with a variety of factors including but not limited to the particular materials from which the mating surfaces of the heatsink and IC are manufactured. With this particular arrangement a method for placing a heatsink on a integrated circuit devices is provided. The thermally conductive matrix material may then be exposed to heat at a predetermined temperature for a predetermined amount of time to thus cure the thermally conductive matrix material thereby securely adhering the heatsink to the integrated circuit housing. However, the thermally conductive material can be cured after bonding to the integrated circuit by heat generated by the integrated circuit. The heatsink-integrated circuit assembly may then be disposed on a printed circuit board. The integrated circuit may be soldered to the printed circuit board via any conventional soldering technique including vapor phase soldering techniques. If vapor phase soldering techniques are used, the thermally conductive matrix material on the heatsink and integrated circuit may be cured simultaneously with the soldering of the integrated circuit to the printed circuit board. The thermally conductive matrix material may be cured, for example, by exposure to a temperature of 225 degrees centigrade for a time period typically of about five minutes.

In accordance with a further aspect of the present invention, a printed circuit board assembly includes a heatsink having first and second opposing surfaces with a thermally conductive matrix material disposed over a first surface thereof. The first surface is then disposed over a first surface of an integrated circuit. A second surface of the integrated circuit is disposed over a first surface of a printed circuit board and the integrated circuit is coupled to the printed circuit board. With this particular arrangement, a printed circuit board assembly having a thermally reliable integrated circuit is provided. By placing the thermally conductive matrix material on the heatsink to form a heatsink assembly and placing the heatsink assembly on the integrated circuit, a convenient and effective technique for mounting electronic devices on printed circuit boards is provided. In particular, the present invention effects economies and efficiency in the manufacture and assembly of heatsink-integrated circuit combinations and provides highly reliable and effective high-conductivity thermal couplings.

In another aspect of the invention, a heatsink interface material for securing a heatsink to an integrated circuit is provided. The interface material includes a core material having opposing first and second surfaces, a first region adjacent the first surface, a second region adjacent the second surface, and an intermediate region between the first and second regions. In an exemplary embodiment, an adhesive is disposed on the first and second surfaces and in the first and second regions while the intermediate region is substantially free of the adhesive. Heat and/or pressure can be used to facilitate penetration of the adhesive into the core material. In one embodiment, copper and then nickel can be deposited, such as by electroless deposition, on the first and second regions of the core.

BRIEF DESCRIPTION OF THE DRAWINGS

The foregoing features of this invention as well as the invention itself may be more fully understood from the following detailed description of the drawings, in which.

DETAILED DESCRIPTION OF THE INVENTION

Figure 1:
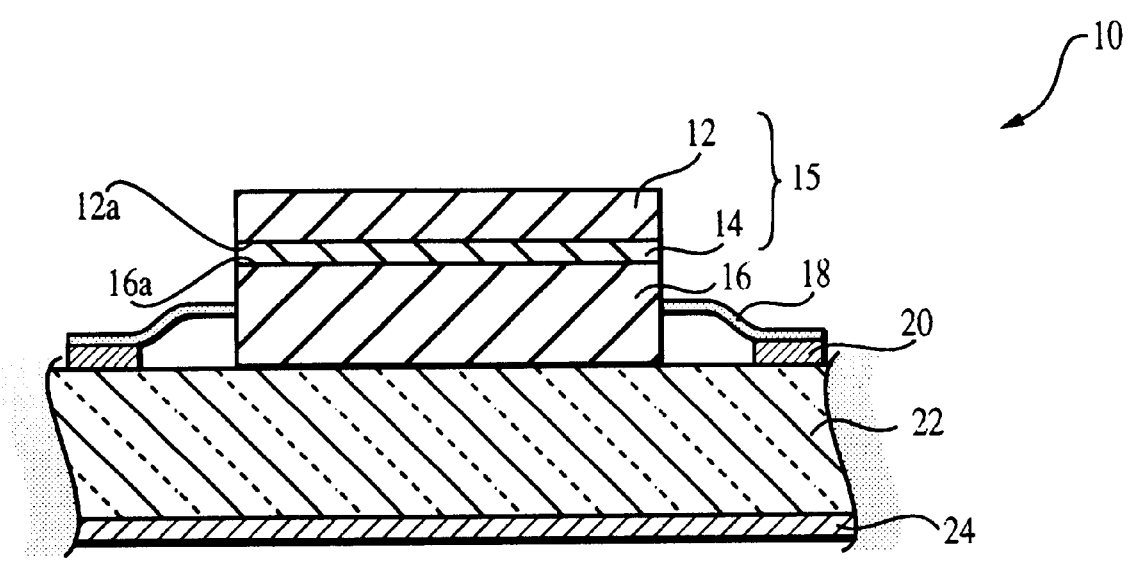
FIG. 1 is a cross sectional view of a heatsink bonded to an integrated circuit in integrated circuit in accordance with the present invention.

Referring now to FIG. 1, a heatsink assembly 10 includes a heatsink 12 having disposed on a first surface 12a thereof a thermally conductive matrix material 14. A thermally conductive matrix material may be provided for example, as a type of manufacture by the Electronics Products Division of W.L. Gore and Associates, Inc., Newark, Del., and identified as part number Gore-Bond MG, or the material shown and described in conjunction with FIGS. 9–13. Heatsink 12 is provided from a material such as Aluminum Silicon (Al Si) Carbide or alternatively, heatsink 12 may be provided from any thermally conductive material including but not limited to aluminum, brass, copper or a zinc-aluminum die cast or zinc alloy material similar to that sold by Noranda Corp. under the trade name Zamak.

It has been recognized that, by providing the heatsink from Al Si carbide and disposing the thermally conductive matrix material on the heatsink 12, a heatsink assembly 15 having a relatively low fatigue stress due to the modulus of elasticity and thermal expansion coefficients of the respective materials is provided. The thermally conductive matrix material 14 is provided having a thickness in the range of about one-half to about ten mils, with a range of about two to about seven mils beings preffered, with about five mils being especially preferred. It should be noted, however, that in some applications, the thermally conductive matrix material may be provided having a thickness greater than ten mils. It is desirable to provide the thermally conductive matrix material having a thickness which minimizes the temperature difference between heatsink 12 and an integrated circuit package 16 to which the heatsink 12 is thermally coupled through the matrix material 14.

It is recognized however, that the matrix material 14 may be provided as a relatively thick layer in those applications in which the surface topology of the heatsink or the integrated circuit will prevent a conformal contact of the surfaces 12a, 16a of the heatsink and integrated circuit through the compressible thermally conductive matrix material 14. In some embodiments it may be desirable to provide the thermally conductive matrix material having a relatively large amount of metal disposed therein.

In the case where clamps are used, depending upon the particular configuration of the heatsink and IC package as well as the moduli of elasticity of the heatsink and IC package materials involved, clamping stresses may cause a deformation such as a bowing or a curvature of the surfaces of the heatsink and IC. This may result in a gap or space between the mating surfaces of the heatsink and the surface of the IC. Thus, to conduct heat between the entire available surface of the IC package and the mating surface of the heatsink, the thermally conductive matrix material should preferably fill the gap to maximize heat transfer between the IC and heatsink surfaces.

Here, the integrated circuit 16 is provided as a static random access memory (SRAM) having electrical contacts 18 extending from side surfaces thereof. The electrical contacts are coupled to conductors 20 which are disposed on a first surface of a printed circuit board 22. A second surface of the printed circuit board has ground plane 24 disposed thereon. Although the integrated circuit is here provided as an SRAM, those of ordinary, skill in the art will appreciate of course that heatsink assembly 15 may be coupled to any type of integrated circuit including but not limited to memory and processor integrated circuits.

Furthermore, heatsink assembly 15 may be coupled to any type of integrated circuit package including but not limited to dual-in-line packages (DIP) leadless chip carriers, leaded chip carriers, flat packs, pin-grid arrays as well as other surface mount packages and small outline integrated circuit packages for surface-mounting.

In the case where surface mounted packages are used, the integrated circuit may be coupled to the printed board conductors 20 via wave soldering which typically includes the use of a solder paste which partially acts as an adhesive prior to reflow and provides surface tension to help align skewed parts during soldering. Alternatively, a vapor phase soldering process may also be used.

Figure 1A:
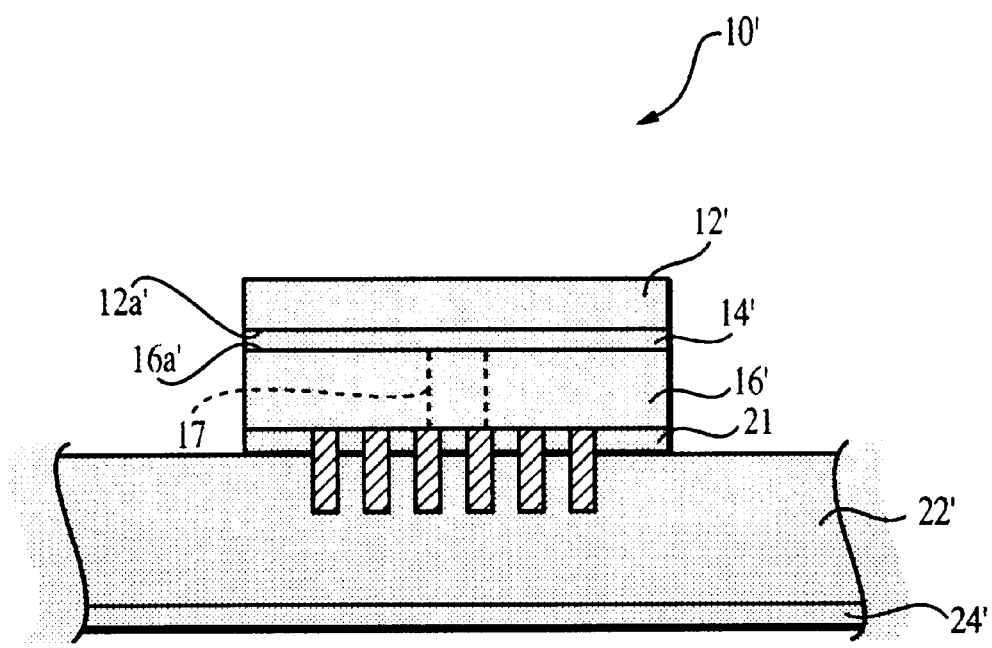
FIG. 1A is a cross sectional view of a heatsink disposed over an integrated circuit having a metal slug in accordance with the present invention.

FIG. 1A shows an alternative embodiment of a heatsink assembly 10' including a heatsink 12' bonded to an integrated circuit 16' having a Pin Grid Array (PGA) type package by a layer of thermally conductive matrix material 14'. The integrated circuit 16' includes a metal slug 17 located in the housing with a portion of the slug in contact with the material 14' to conduct heat to the heatsink 12'. A further layer of thermally conductive material 21 can be disposed on an underneath surface of the integrated circuit to bond the integrated circuit to a printed circuit board. Thus, some of the heat generated by the integrated circuit 12' will be conducted to the circuit board 22' by the further layer of thermally conductive material 21. A connection (not shown) can also be made from a ground plane 24 of the printed circuit board 22" and the integrated circuit and/or matrix material.

Figure 1B:
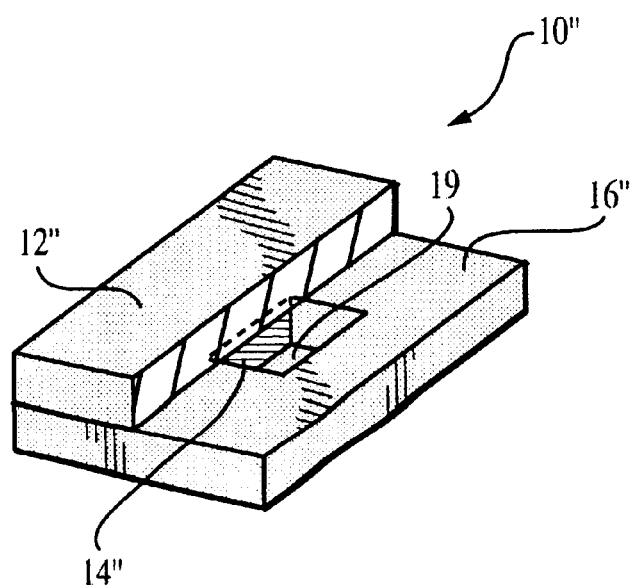
FIG. 1B is a perspective view, in partial cross section, of a heatsink bonded to a die within an integrated circuit in accordance with the present invention.

FIG. 1B shows a further embodiment of a heatsink assembly 10" in accordance with the present invention shown in partial cross section. The heatsink assembly 10" includes a heatsink 12" and an integrated circuit 16" having an exposed portion 19 of a die which is housed in the integrated circuit. A layer of thermally conductive material 14" is in contact with the exposed portion 19 of the die to more effectively cool the integrated circuit. The layer of thermally conductive material also bonds the integrated circuit and heatsink together.

Figure 2:
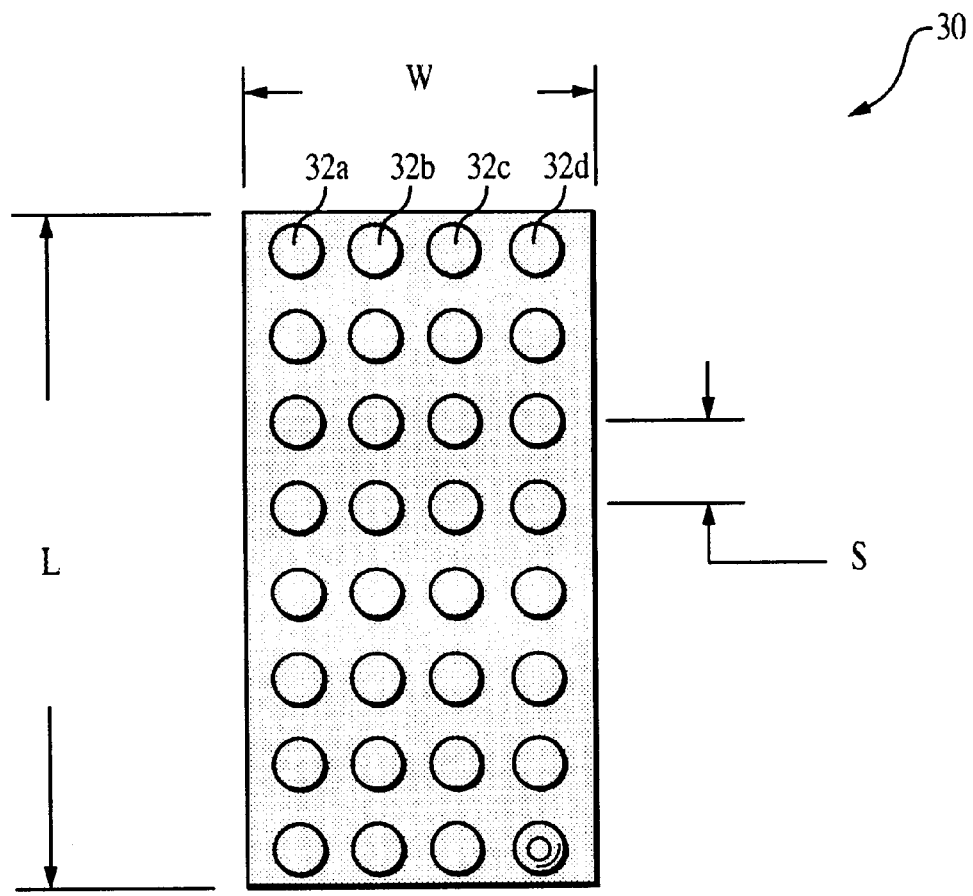
FIG. 2 is a top view of an exemplary heatsink.
Figure 2A:
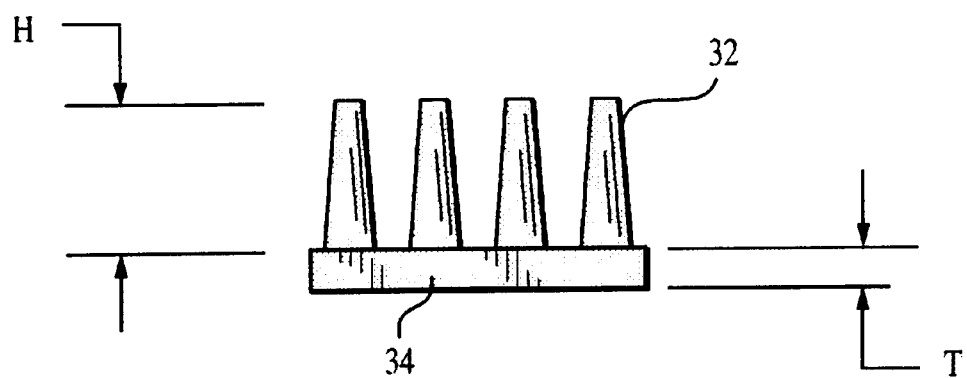
FIG. 2A is a side view of heatsink.

Referring now to FIGS. 2 and 2A in which like elements are provided having like reference designations, heatsink 30, which may be of the type described above in conjunction with FIG. 1, includes a base portion 34 having a rectangular shape with a length (L) typically of about 0.775 inches and a width (W) typically of about 0.375 inches and a thickness (T) typically of about 0.050 inches.

A plurality of pins 32 project from a first surface of the base 34. The pins 32 may be provided having a tapered shape with a first end of the pins having a diameter typically of about 0.035 inches and a taper from a first pin portion to a second pin portion defined by an angle typically of about five degrees. The center-to-center spacing (S) between the pins is typically about 0.1 inch. The heatsink 30 is preferably provided from a material such as Aluminum Silicon (Al Si) carbide. In a preferred application, the thirty-two pin heatsink has a thermally conductive matrix material deposed over a first surface of the base and is disposed over to a first surface of a static random access memory (SRAM).

The particular geometry of the heatsink should be selected to provide a heat transfer coefficient which maintain the temperature of an integrated circuit to which the heatsink is coupled below a predetermined temperature. The thermal fins or pins extending from the base which is contact with the integrated circuit are provided having a shape which increases the heat transfer ability of the base portion of the heatsink. The thermal resistance between the thermal conductive matrix material and the heatsink should be selected to minimize any thermal resistance discontinuities in the heat flow path between the integrated circuit an d the heatsink.

Figure 3:
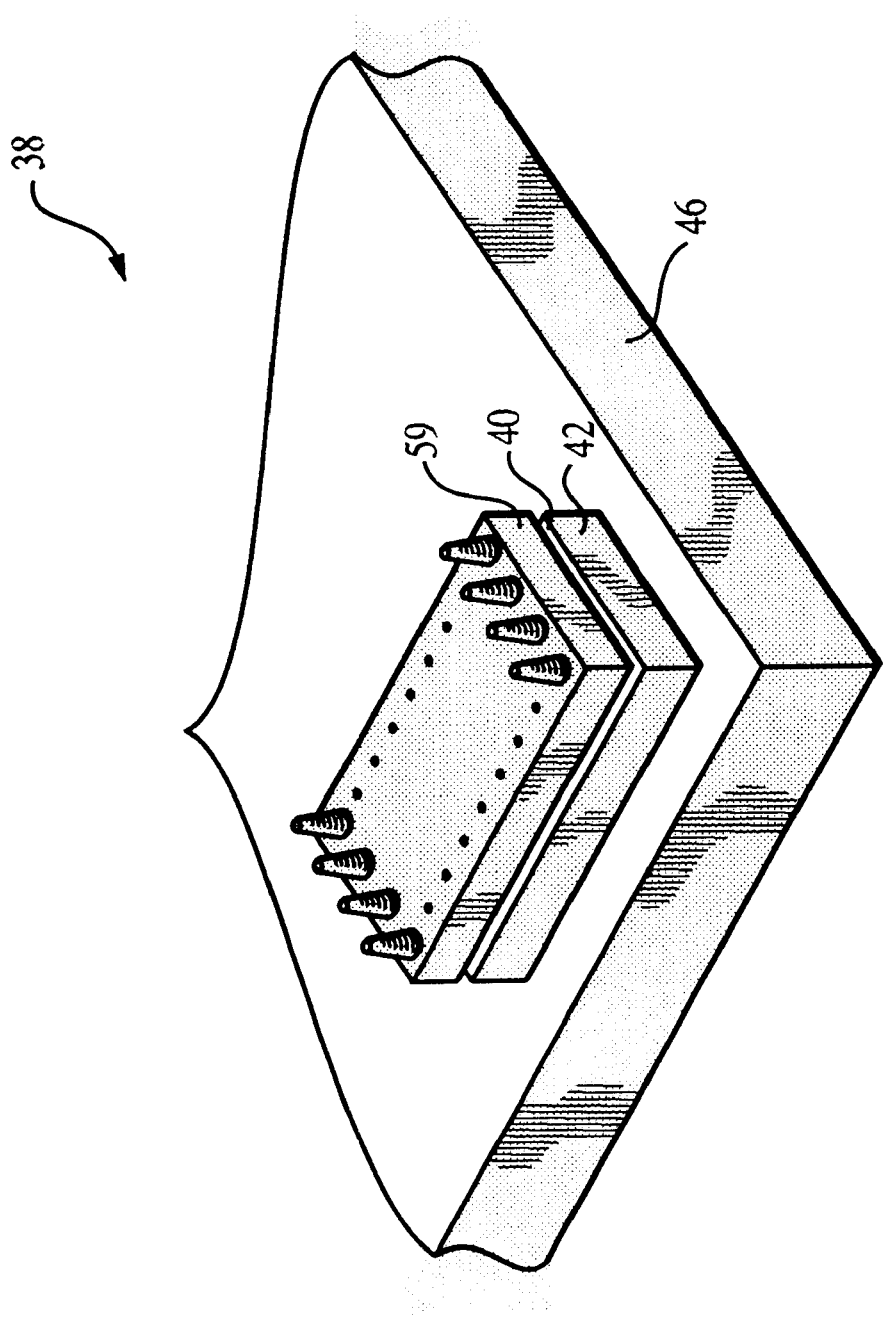
FIG. 3 is a perspective view of a printed circuit board having a heatsink disposed on an integrated circuit which is coupled to a printed circuit board.

Referring now to FIG. 3, a heatsink 39 is shown disposed over a first surface of an integrated circuit 42 which is disposed on a printed circuit board 46. Disposed between a first surface of an integrated circuit and a first surface of a heat sink is a sheet of a thermally conductive matrix material 40. The matrix material 40 facilitates an extraction of heat from the semiconductor package 42 to the heatsink 39. Typically, the semiconductor package has a relatively high coefficient of thermal expansion but a relatively low modulus of elasticity and thus, when the package is coupled to the internal silicon die relative motion results due to heating of the semiconductor package. By adhering the thermally conductive matrix material and heatsink together on the integrated circuit package, the integrated circuit has improved thermal and electrical characteristics-due to reduced mechanical stress.

The thermally conductive matrix material 40 is coupled to the heatsink 39 by applying a sheet of the matrix material to a surface of the heatsink and applying a force of 0.1 to 100.0 psi, and more preferably about 50.0 psi, to the matrix material to thus adhere the sheet of matrix material to the heatsink. A roller can be used to apply the pressure to the matrix material. An exemplary roller has a cylindrical shape with a diameter in the range of about 0.1 to 5.0 inches, but preferably, about 0.5 to 0.75 inches.

Figure 4:
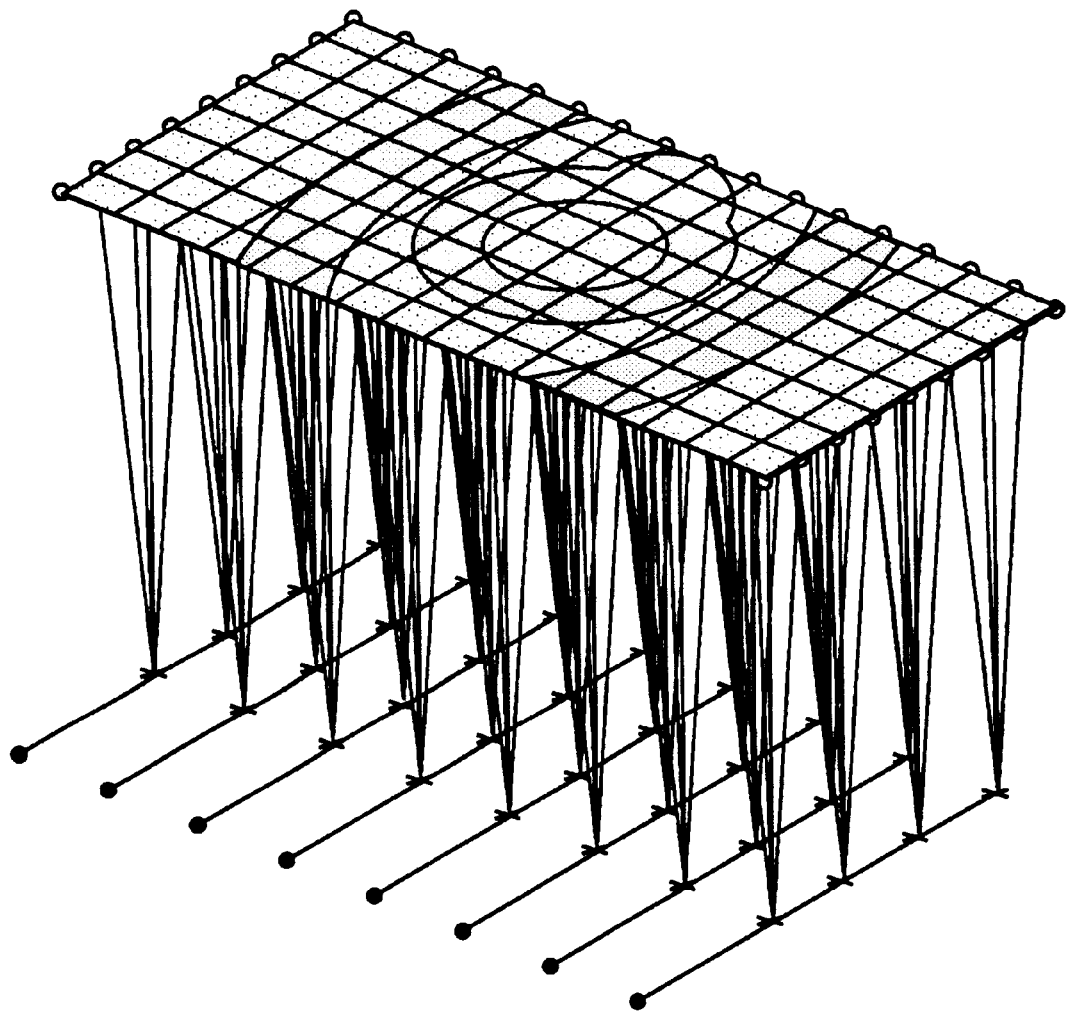
FIG. 4 is a plot of a thermal profile of a 32 pin heatsink.

Referring now to FIG. 4, a plot of thermal conductivity of the heatsink of FIG. 2 illustrates that first portions of the heatsink becomes hotter than second portions of the heatsink. The plot illustrates a temperature gradient map of the interface surface between a heatsink and an IC. As can be seen in the plot, the center portions of the IC, where the silicon die is located and thus where a relatively large percentage of the heat is generated, is hotter than the more remote or exterior regions of the IC. Even for an IC that is perfectly flat at uniform temperature, the temperature gradient resultant due to operation of the IC, may cause the IC to bend and distort away from an ideal uniform planar interface with a heatsink due to the non-uniform expansion of the package material of the IC.

Figure 5:
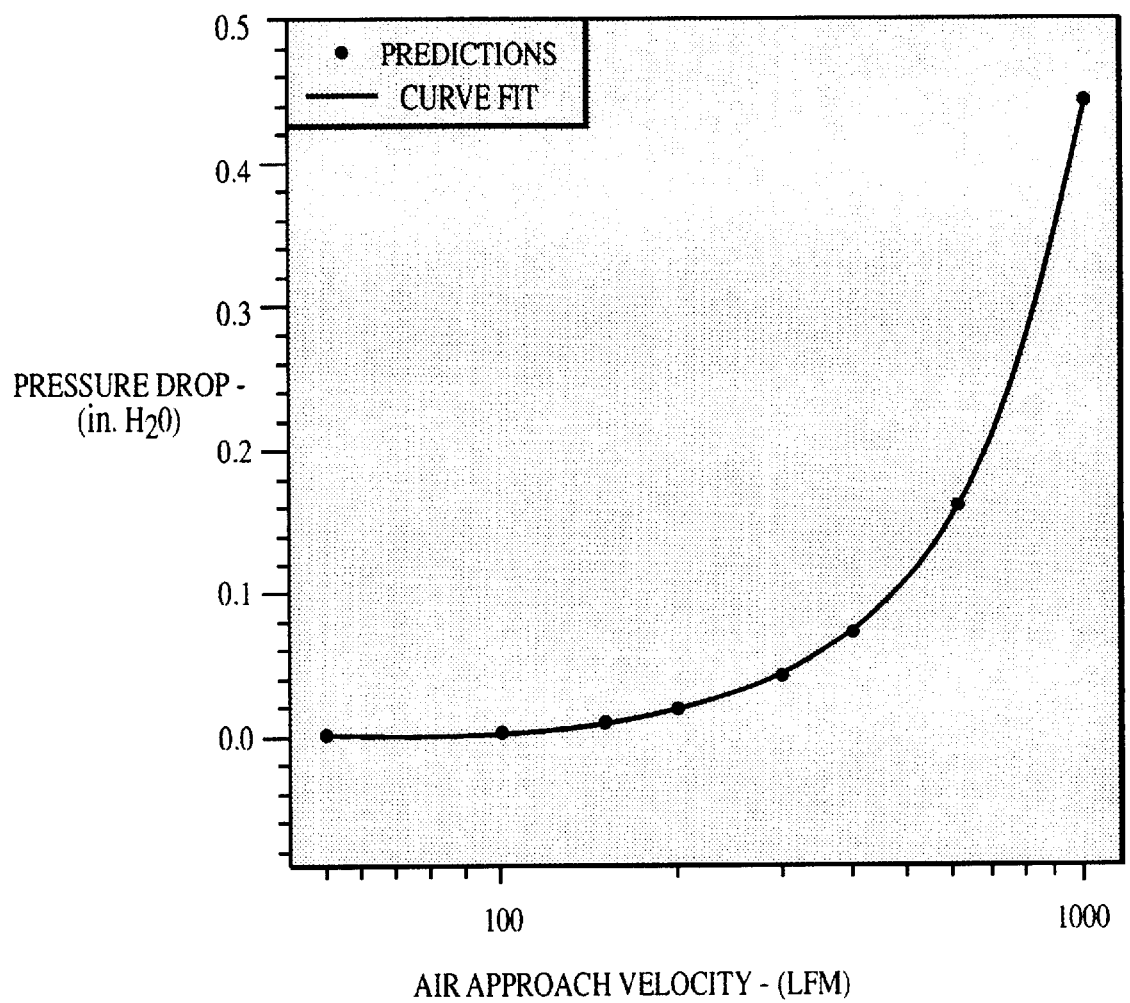
FIG. 5 is a plot of pressure drop versus air approach velocity.

Referring now to FIG. 5, a plot of pressure drop versus air approach velocity shows that air velocity over and through the heatsink can be increased by increasing the driving pressure of the air, but again improvements are achieved at a decreasing rate.

Figure 6:
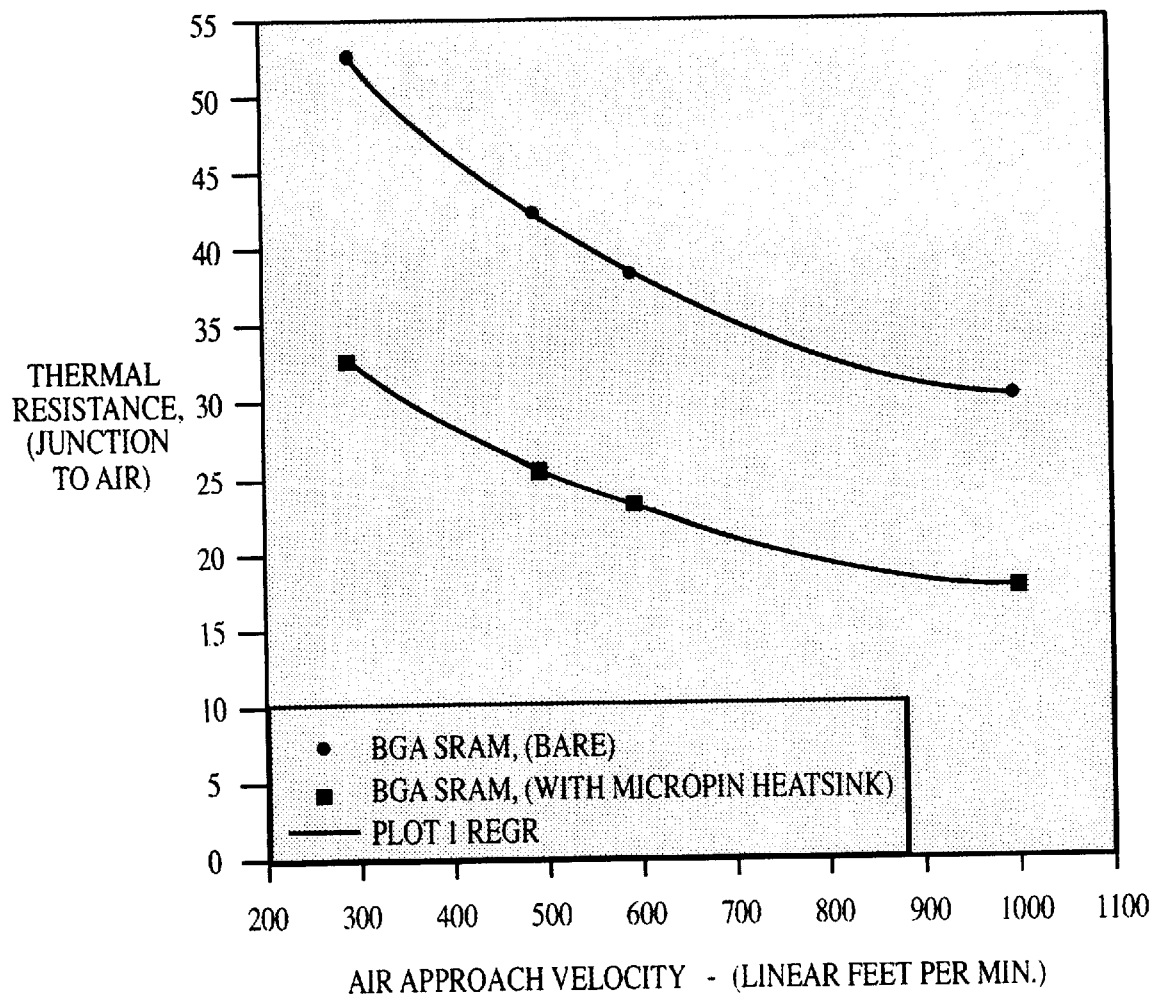
FIG. 6 is a plot of thermal resistance versus air approach velocity.

Referring now to FIG. 6, a plot of thermal resistance versus air approach velocity shows an SRAM to which a heatsink assembly of the type described above in conjunction with FIG. 1 having improved thermal performance. Thermal resistance improves due to use of a heat sink assembly, such as heatsink assembly 15 (FIG. 1), and can be combined with an increase in air velocity to thus further improve the thermal performance of the SRAM.

Figure 7:
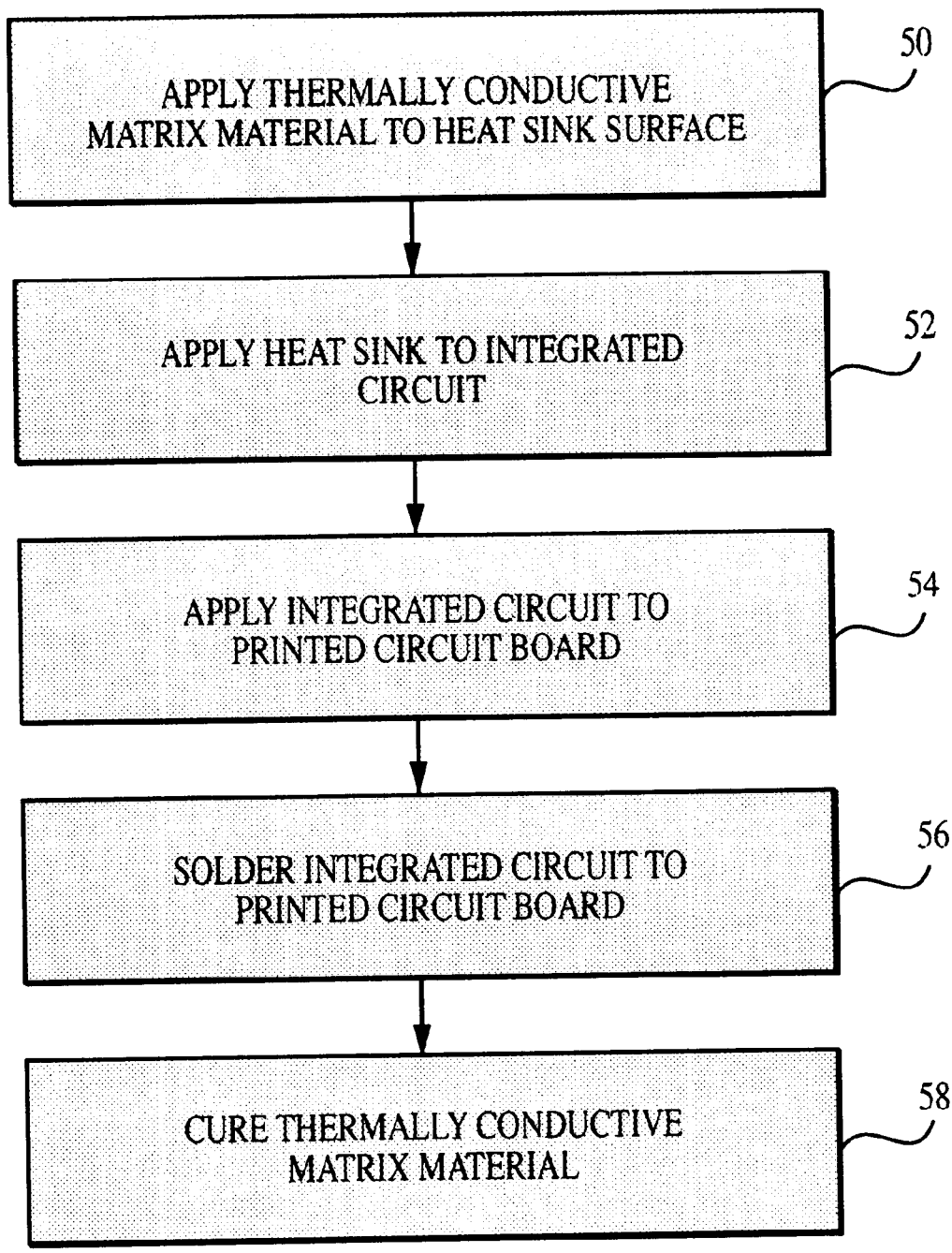
FIG. 7 is a flow diagram showing the steps performed in mounting a heatsink to an integrated circuit.

Referring now to FIG. 7, the steps to provide a heatsink assembly are shown. In step 50, the thermally conductive matrix material is applied to a first surface of the heatsink. Since the thermally conductive matrix material includes an adhesive resin, the matrix material is applied to the first surface of the heatsink and thus, the heatsink and thermally conductive matrix material may be handled as a heatsink assembly. The matrix material can have opposing surfaces with release paper on one or both surfaces that would be removed before application to another surface.

Figure 7A:
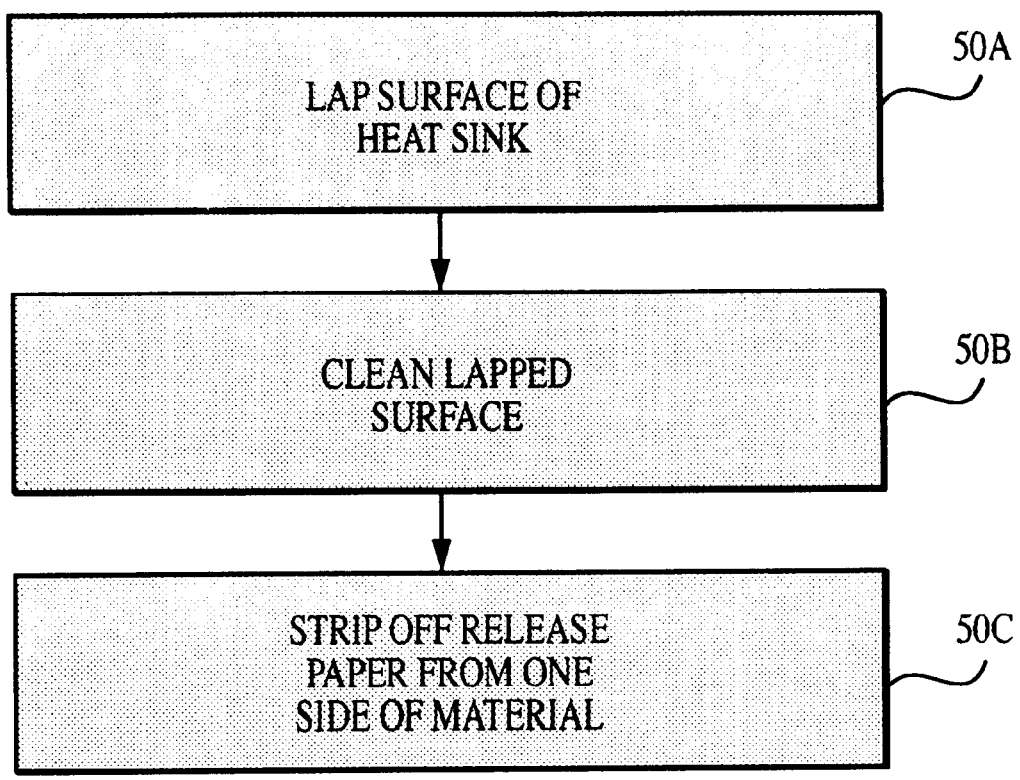
FIG. 7A is a flow diagram further defining the flow diagram of FIG. 7.

As shown in FIG. 7A, prior to applying the thermally conductive material to the heatsink, the surface of the heatsink can optionally be prepared to accept the material. In step 50A, the surface of the heatsink can be lapped, for example by an abrasive pad disposed on a relatively flat hard surface such as would be provided by a granite surface, to ensure that the heatsink surface is flat and thus provide a thermal path having a substantially consistent thermal impedance. After lapping the surface, the heatsink surface should be washed to remove debris, grease, and other contaminants, as in step 50B. The wash, may for example, be provided as an acetone wash, or other solution suitable for cleaning the material from which the heat sink is provided. In step 50C, for a thermally conductive matrix material having a release paper on one or both of opposing surfaces, one release paper is removed.

Referring again to FIG. 7, in step 52, the heatsink assembly is then applied to a first surface of an integrated circuit after removing any remaining release papers on the material. Generally, the integrated circuit is then disposed in an appropriate location of a printed circuit board in step 54. In step 56, the printed circuit board is then placed in a soldering apparatus which may be provided as a vapor phase soldering apparatus. Prior to insertion in the vapor phase soldering apparatus, a solder paste is applied to predetermined locations of the printed circuit board to thus allow the electrical contacts of the integrated circuit to be coupled to corresponding electrical conductors on the printed circuit board. During the vapor phase soldering step, the solder paste changes state from paste to fluid and thus flows thereby soldering the electrical leads of the integrated circuit to predetermined portions of the printed circuit board.

In step 58, simultaneous with the soldering of the integrated circuit to the printed circuit board, the thermally conductive matrix material and corresponding adhesive is cured to both the heatsink and the integrated circuit thereby securing the heatsink to the integrated circuit. It should be noted that such curing may take place by exposing the thermally conductive matrix material to a temperature typically of about 225 degrees centigrade for a time period typically of about five minutes. Alternatively, the thermally conductive matrix material may be cured by exposing the matrix material to a temperature of about 150 degrees centigrade for a time period typically of about 60 minutes.

However, it is to be understood that the material need not be cured in order to bond the thermal interface material to the heatsink or integrated circuit. The amount of resin and curing agent in the matrix adhesive is selected to obtain the desired bonding strength. It is further understood that curing of the material can take place during normal operating conditions for the integrated circuit. The heat generated by the integrated circuit wets the resin in the matrix material to the surface such that the resin changes to a partially liquid state thereby improving the adherence properties of the thermal interface material to thus hold the heatsink to the integrated circuit.

It should also be noted that in some applications it may be desirable to place the integrated circuit on the printed circuit board prior to placing the heatsink/thermally conductive matrix material assembly on to the integrated circuit. It should also be noted that in some applications it may be desirable to apply the thermally conductive matrix material first to the surface of the integrated circuit and then to mount the heatsink to the integrated circuit/thermally conductive matrix assembly.

The selection of the particular type of soldering process to be used depends in part upon the type of components being assembled on the printer circuit board and, whether or not a mixed-technology or all-surface-mount assembly is being manufactured. Depending on the component mix, the typical soldering processes include wave soldering and a variety of reflow soldering techniques that are based on the use of either vapor-phase (condensation) energy, infrared (IR) energy, lasers, hot-belt conduction, or hot gases. Each soldering process has a corresponding set of manufacturing parameters for which it is best suited. Another consideration is for the use of a low-volume batch processing unit or a high-volume soldering system.

It should be noted that for heatsinks provided from a material such as Aluminum Silicon Carbide (AlSiC) the expansion coefficient of the AlSiC and the expansion coefficient of the silicon die of the IC are relatively close. Furthermore a heatsink manufactured from AlSiC and a silicon die both have a relatively high modulus of elasticity. Even though the plastic encapsulating the IC has a much higher coefficient of thermal expansion than the AlSiC or silicon die, the modulus of elasticity of the encapsulating plastic is relatively low when compared with that of metals.

This means that the stress at a joint formed by the interface of the heatsink, the thermally conductive matrix material, the encapsulating plastic and the silicon die is dominated by the AlSiC and silicon die. Since the expansion coefficients of the AlSiC and silicon die are relatively close compared with the expansion coefficient of plastic, the joint stress resultant from exposure to temperature extremes is relatively low, and is lower than the fatigue limit of the bonding material joint.

The thermally conductive matrix material includes a resin or bonding material and the layer of the thermally conductive matrix/bonding material can thus be provided as a relatively thin layer of material while the silicon die and the encapsulating plastic still experience acceptable stresses. Application of a relatively thin layer of a thermally conductive matrix material results in a relatively thin bond line which allows higher heat conduction between the IC package and the heatsink. Furthermore, the strength of the bond can be adjusted by controlling the amount of resin contained in the thermally conductive material. It may be desirable to limit the strength of the bond so that the heatsink can be removed without destroying the integrated circuit and/or the heat sink, for example.

The following table shows the values of the relevant properties:

| Material | Modulus of Elasticity (PSI × 10$^6$) | Expansion coefficient (PPM/deg C) |
| --- | --- | --- |
| Aluminum | 10.2 | 23 |
| Copper | 16 | 17 |
| Silicon | 22.6 | 4–7 |
| AlSiC | 37 | 7 |
| Plastic Encapsulating Compounds | 0.35 | 20–40 |

Figure 8A:
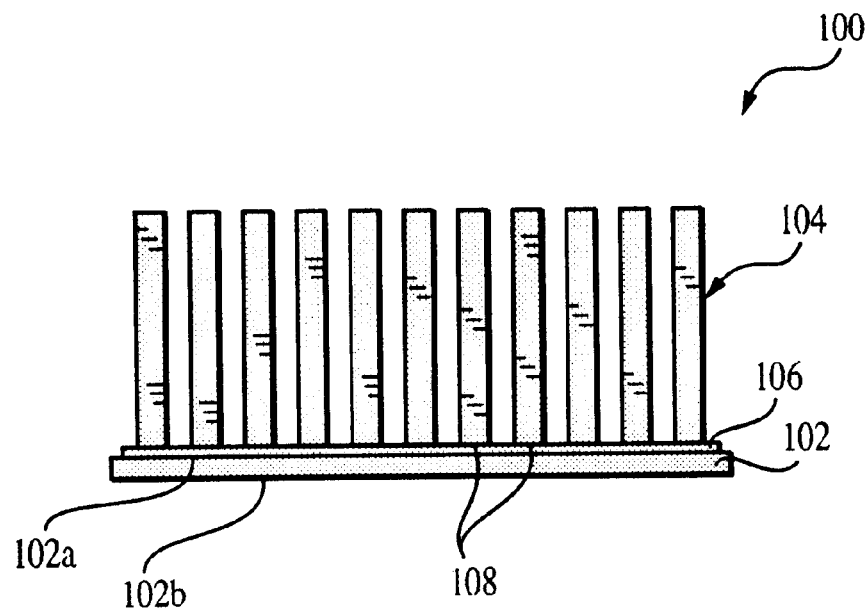
FIG. 8A is a side view of a further embodiment of a heatsink assembly in accordance with the present invention.
Figure 8B:
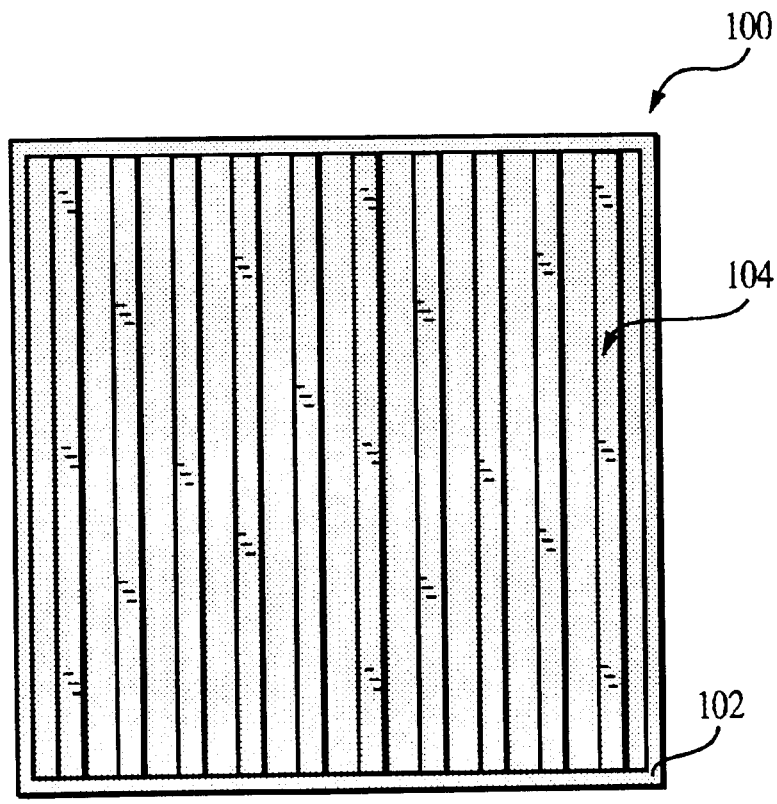
FIG. 8B is a top view of the heatsink assembly of FIG. 8A.

FIGS. 8A and 8B show a further embodiment of a heatsink assembly 100 including a flat plate 102 and folded fin member 104 bonded together by a thermally conductive matrix material 106. The flat plate 102 is formed from a thermally conductive material and includes a first surface 102a and an opposing second surface 102b. The folded fin member 104 is formed from a thin sheet of thermally conductive material which is folded at predetermined intervals. The folded fin member 104 includes a series of contact surfaces 108 for contacting the first surface 102a of the flat plate or other surface. In an exemplary embodiment, the contact surfaces 108 are substantially flat for abutting the first surface 102a of the flat plate. The thermally conductive matrix material 106 is disposed between the flat plate and the folded fin member contact surfaces 108 to bond the folded fin member and the plate and provide a path of low thermal resistance. It will be appreciated that the matrix material can be placed at discrete locations, at one or more of the contact surfaces for example, or can be a continuous layer.

In an exemplary embodiment, the flat plate 102 and the folded fin member 104 are both formed from aluminum. Since both components 102, 104 of the heatsink assembly are of the same material having the same thermal expansion characteristics, thermally-induced mechanical stress between the components is reduced as compared with components of differing coefficients of thermal expansion.

In an illustrative embodiment, the folded fin member 104 has a thickness in the range of about one mil to about twenty mils, and preferably having a thickness in the range of about two mils to about ten mils, and even more preferably having a thickness of about 0.01 inches. The bonded construction of the heatsink assembly allows the use of a thinner folded fin member 104, as compared with an integral member-plate arrangement. The thinner folded fin member 104 provides an improved aspect ratio and therefore a lower pressure drop is realized for air passing through the heatsink assembly 100.

In an exemplary embodiment, the heatsink assembly has about a one inch by three inch nominal cross section, with the flat plate being about three inches square. The number of fins per inch can vary and without limitation thereto, thirteen fins per inch has been found to be effective number.

It will be appreciated by one of ordinary skill in the art that a heatsink assembly in accordance with the present invention provides thermal resistance advantages over prior art heatsink assemblies. For example, parts joined with a non-matrix epoxy or other thick adhesive do not provide the low thermal impedance path provided by the matrix adhesive while dip brazed joints may provide equivalent thermal impedance, they are much more expensive and time consuming to produce.

Figure 9:
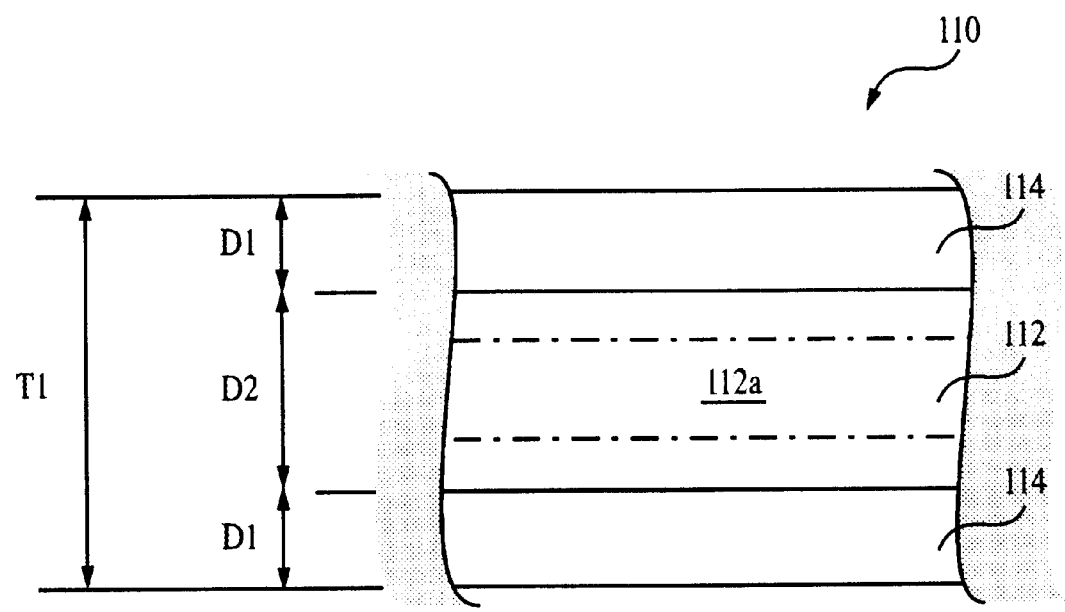
FIG. 9 is a cross-sectional view of a heatsink interface layer in accordance with the present invention.

Referring now to FIG. 9, an interface layer 110 having a thickness T1, which is typically in the range of about 0.002 inch to about 0.030 inch, includes a core that can be provided from a thermally conductive matrix layer 112. Opposing surface regions of the core or matrix layer 112 include an adhesive 114 layer into which adhesive is embedded or forced to migrate into portions of the matrix layer 112 using an exemplary technique described below in conjunction with FIG. 10. It is understood that, in general, adhesive layer 114 refers to a region of the matrix layer into which adhesive has penetrated. It is further understood that the drawings are intended to facilitate an understanding of the invention and are not to scale.

The matrix material 112 may be provided, for example, as the type manufactured by Advanced Performance Materials, Inc., and sold as part no. 3020–201. Those of ordinary skill in the art should appreciate of course that the core matrix material 112 may also be provide as rip-stop nylon, felt, woven cloth, open cell plastic foam, and other materials having similar characteristics. As used herein, felt is understood to refer to a non-woven fibrous fabric. The felt should have volume compressibility and an open porous structure so that the matrix may be compressed. In addition, the felt should have sufficient strength so that the material can be formed into a pad. The adhesive used to form the adhesive layers 114 is commercially available and may be provided, for example, as the type manufactured by Adhesives Research, Inc. and sold as Arclad 8026.

The structure 110 is provided having a thickness typically in the range of about 0.002 inch to about 0.030 inch, with a thickness of 0.005 inch being preferred. The adhesive material 114 is forced, absorbed or otherwise driven into the matrix material 112 so that adhesive penetrates into the fibers of the matrix material 112. It is desirable that the adhesive not be completely absorbed into the resulting structure, but reside in the outer regions of the matrix, so that the compressibility and surface conformability of the structure is not lost. In general, it is desirable to provide the interface structure 110 as a relatively thin structure. If the adhesive layers 114 have a thickness which is greater than a predetermined maximum thickness, then the structure 110 has relatively poor electrical performance but good adhesion characteristics. On the other hand, if the adhesive layers 114 are provided having a thickness which is less than a predetermined minimum thickness, then the structure 110 has relatively poor electrical performance and relatively poor adhesion characteristics.

Figure 9A:
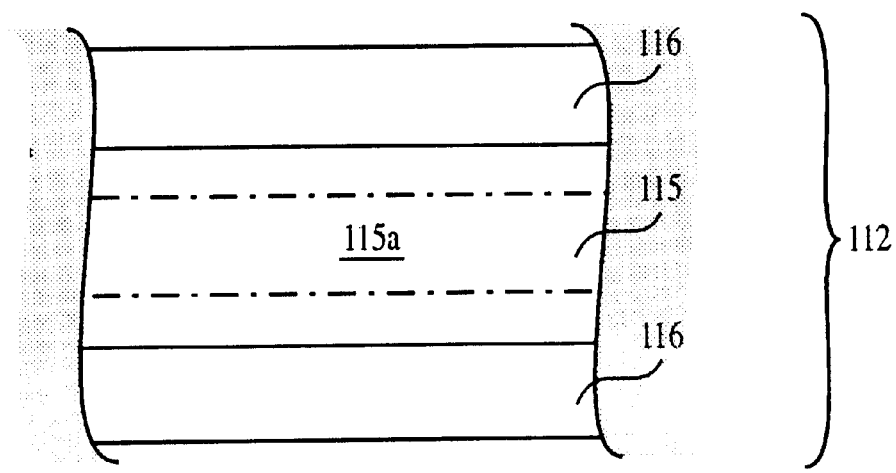
FIG. 9A is a cross-sectional view of a further embodiment of the interface layer of FIG. 9.

Referring briefly to FIG. 9A, the interface material 112 may be formed by metalizing first and second opposing regions of a core material such as a polyester-felt core material 115. It is understood that the fibers of the felt material are metalized so that the dimensions of the overall structure are relatively unchanged. In one embodiment, the core material 115 is metalized via an electroless copper deposition technique to provide metalized regions or layers 116. The metalized regions 116 can also be metalized by depositing nickel in addition to copper, via an electroless technique. An exemplary weight of a copper and nickel metalization is about 0.5 to about 1.1 Oz./Sq. Yd. for the 0.005 inch thick product. In an exemplary embodiment, the thickness of the resultant product is within plus or minus ten percent of the original matrix layer thickness. The core material 115a is metalized with the copper and nickel 116 and thus the matrix layer 112 is provided having a copper base and a nickel surface, which provides a corrosion barrier against aluminum. The result is a polyester-felt core 115 which has been metalized but which has been left with a hollow central region 115a. That is, the porous, compressible structure of the felt remains, but the individual fibers of the felt have been metalized into a continuous thermally and electrically conductive matrix.

Figure 10:
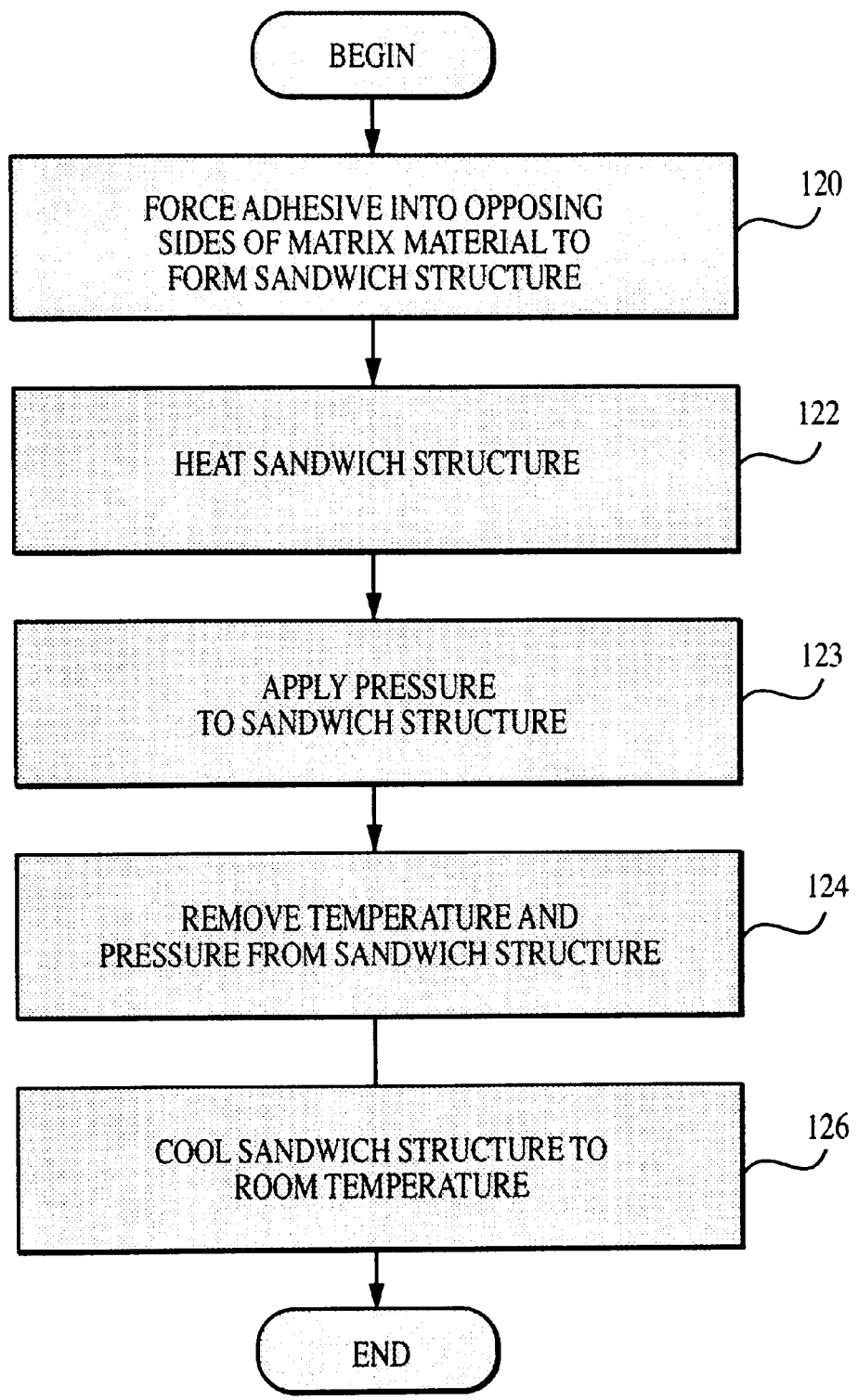
FIG. 10 is a flow diagram showing an exemplary method for fabricating the interface layer of FIG. 9.

FIG. 10 is a flow diagram showing the steps performed to provide an interface material of the type described above in conjunction with FIG. 9. The rectangular elements (e.g. block 120) in the flow diagram are herein denoted "processing blocks" and represent steps or instructions or groups of instructions. Some of the processing blocks can represent an empirical procedure or a database while others can represent computer software instructions or groups of instructions. Thus, some of the steps described in the flow diagram may be implemented via computer software while others may be implemented in a different manner e.g. via an empirical procedure.

The flow diagram does not depict the syntax of any particular programming language or any specific steps. Rather, the flow diagram illustrates the functional information one of ordinary skill in the art requires to perform the steps or to provide a system or to perform the steps required to processing required of the particular apparatus. It should be noted that where computer software can be used, many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit of the invention.

Turning now to FIG. 10, processing begins in step 120 where adhesive is forced into opposing sides of a matrix material to form a sandwich structure having regions of embedded adhesive. Processing then proceeds to step 122 where the sandwich is optionally heated to a predetermined temperature. An exemplary temperature range is from about room temperature to about 150 degrees Celsius for a time between about five seconds to about two minutes.

Processing then proceeds to step 123 where pressure is applied to the sandwich structure. A pressure distribution surface is disposed on opposing sides of the sandwich to ensure that pressure is applied equally to the surfaces of the sandwich. The sandwich is subject to a force which causes the adhesive to migrate a predetermined distance into the matrix material. The fibers of matrix layer 112 penetrate or nearly penetrate the adhesive 114. It is desirable that the adhesive not be completely or uniformly absorbed into the resulting structure. The adhesive should reside in the surface regions of the matrix, so that the compressibility and surface conformability of the structure is not lost. In general, it is desirable that the adhesive penetrate from each face of the matrix less than half way to the center line. The particular force and amount of time for which the force is applied is selected in accordance with a variety of factors including but not limited to the temperature to which the sandwich is subject in the press as well as the thickness of the matrix and adhesive layers and the final application of the total structure.

By heating the sandwich, less pressure is needed for a given period of time. Alternatively, the same pressure can be applied for a shorter period of time. In short the process of the present invention can result in an appropriate interface material by adjusting the parameters of pressure, temperature and time to force or drive the adhesive material a predetermined distance into the matrix material. Thus by heating the sandwich, for example, an advantageous interface material can be provided while applying a lower pressure for a shorter time period of time.

It should be noted that application of too much pressure drives the a majority of the adhesive into the matrix material such that not enough adhesive material is left on the surface region of the matrix material thus resulting in an interface material which has poor adhesive characteristics. On the other hand, if not enough pressure is applied to the adhesive, then a relatively large amount of matrix material is left on the surface of the matrix such that the interface material has relatively good adhesive characteristics but relatively poor electrical performance characteristics.

It should be appreciated that the goal is to provide an interface structure in which the adhesive material has migrated a distance into the matrix material such that the resultant interface material has preferred thermal, electrical and adhesive characteristics. That is, the interface material should provide a means to securely couple a heatsink to a heat-generating device (such as a printed circuit board or an integrated circuit) while at the same time providing a good thermal and electrical path between the heat sink and the heat generating source.

After application of an appropriate amount of pressure, the adhesive migrates a predetermined distance into both sides of the matrix material but a central region of the material (e.g. region 112a in FIG. 1) is substantially free from the adhesive material (i.e. the adhesive material has not migrated or been driven into region 112a). It is important that the matrix material not be fully filled so as to maintain the flexibility of the interface material 110.

Processing next proceeds to steps 124 and 126 where, after a predetermined amount of time, the pressure is released from the sandwich and, if the sandwich has been exposed to an elevated temperature, the sandwich is returned to room or ambient temperature.

After the processing is complete, the final thickness of the interface material after pressing is about the same, i.e., +/−10 percent, as the starting thickness of the matrix material. For example, if the matrix layer is provided having a thickness of about 0.005 inch before application of pressure, and the adhesive layers are provided having thicknesses of about 0.001 inch+/−0.0002 inch before application of pressure, then after applying pressure (with or without application of heat) the thickness of the interface material (e.g. interface material 110 in FIG. 9) is about 0.0055 inch. An interface material manufactured in accordance with this process has better thermal characteristics than bare matrix material. The fact that by adding the adhesive to the matrix material improves the thermal characteristics is unexpected since one of ordinary skill in the art would expect that placing two layers of poorly conducting adhesive in series with bare matrix material would result in poorer, not better thermal performance.

One of ordinary skill in the art will realize further features and advantages of the invention from the above-described embodiments. Accordingly, the invention is not to be limited by what has been particularly shown and described, except as indicated by the appended claims. All references cited herein are expressly incorporated by reference in their entirety.

What is claimed is:

1. A method of fabricating a heatsink assembly, comprising:
providing a layer of a core material having opposing first and second surfaces;
forcing an adhesive into the first and second surfaces;
securing the first surface of the core material to an integrated circuit;
securing the second surface of the core material to a heat sink so as to form the heat sink assembly.

2. The method according to claim 1, wherein forcing the adhesive into the core material includes providing an intermediate region between the first and second surfaces that is free of the adhesive.

3. The method according to claim 1, wherein the core material has a thickness ranging from about 2 mils to about 30 mils prior to forcing the adhesive into the core material.

4. The method according to claim 3, wherein the core material has a thickness ranging from about 2 mils to about 30 mils after forcing the adhesive into the core material.

5. The method according to claim 1, further including heating the core material to a temperature in the range from about 37 degrees Celsius to about 150 degrees Celsius.

6. The method according to claim 1, wherein forcing the adhesive into the first and second surfaces includes applying pressure to the core material in the range of 10 to 600 psi.

7. The method according to claim 6, wherein a thickness of the core material after applying pressure is greater than or equal to about 50 percent of a thickness of the core material prior to forcing adhesive into the core material.

8. The method according to claim 1, further including metalizing the first and second surfaces of the core material with copper.

9. The method according to claim 1, further including metalizing the first and second surfaces of the core material with copper using an electroless process.

10. The method according to claim 8, further including metalizing the first and second surfaces of the core material with nickel.

11. The method according to claim 8, further including metalizing the first and second surfaces of the core material with nickel using an electroless process.

12. The method according to claim 1, further including selecting the core material from the group consisting of rip-stop nylon, felt, open cell foam and woven cloth.

13. The method according to claim 1, further including selecting the adhesive from the group consisting of acrylics, polybutadienes, epoxies, and silicones.

14. A method of fabricating a heatsink interface material, comprising:
providing a layer of a core material having opposing first and second surfaces, a first region adjacent the first surface, a second region adjacent the second surface and an intermediate region adjacent the second surface;
applying an adhesive onto the first and second surfaces; and
forcing the adhesive into the first and second regions such that the intermediate region remains substantially free of the adhesive.

15. The method according to claim 14, further including depositing copper onto the first and second surfaces of the core material.

16. The method according to claim 15, further including depositing nickel onto the first and second surfaces of the core material.

17. The method according to claim 14, further including heating the core material to a temperature greater than about 37 degrees Celsius.

18. The method according to claim 14, further including applying pressure to the first and second surfaces of the core material to force the adhesive into the core material.

19. A method of mounting a heatsink assembly onto a surface of an integrated circuit, comprising the steps of:
providing a heatsink assembly including a heatsink having a flat surface and a layer of thermally conductive matrix material having an adhesive forced into first and second surfaces of the matrix material;
applying the first surface of the thermally conductive material to the flat surface of the heatsink; and
applying the second surface of the thermally conductive material to the surface of the integrated circuit.

20. The method according to claim 19, further including the steps of:
lapping the flat surface of the heatsink before applying the first surface of the thermally conductive matrix material to the flat surface of the heatsink; and
washing the flat surface of the heatsink.

21. The method according to claim 19, wherein the heatsink is formed from aluminum silicon carbide.

22. The method according to claim 19, wherein the step of applying the first surface of the thermally conductive material further includes the step of removing a release paper from the first surface of the material.

* * * * *

UNITED STATES PATENT AND TRADEMARK OFFICE
CERTIFICATE OF CORRECTION

PATENT NO. : 6,339,875 B1
DATED : January 22, 2002
INVENTOR(S) : Larson

It is certified that error appears in the above-identified patent and that said Letters Patent is hereby corrected as shown below:

Title page, Item [54] and column 1, line 1,
Delete "METHOD FOR REMOVING HEAT FROM AN INTEGRATED CIRCUIT" and replace with -- METHOD AND APPARATUS FOR REMOVING HEAT FROM AN INTEGRATED CIRCUIT --.

Column 1,
Line 6, delete "1997 ," and replace with -- 1997, --.
Line 8, delete "1996 ," and replace with -- 1996, --.
Line 60, delete "devices circuits" and replace with -- devices, circuits --.

Column 3,
Line 35, delete "rregularities" and replace with -- irregularities --.
Line 57, delete "Re. 25,1884," and replace with -- Re. 25,184, --.

Column 4,
Line 16, delete "from a Aluminum" and replace with -- from an Aluminum --.
Line 49, delete "may bonded" and replace with -- may bond --.

Column 5,
Line 5, delete "a integrated circuit device is" and replace with -- an integrated circuit device is --.
Line 66, delete "circuit in integrated circuit in accordance" and replace with -- circuit in accordance --.

Column 8,
Line 27, delete "which maintain" and replace with -- which maintains --.
Line 30, delete "which is contact" and replace with -- with is in contact --.
Line 52, delete "characteristics-due" and replace with -- characteristics due --.
Line 65, delete "becomes" and replace with -- become --.

Column 9,
Line 45, delete "heat sink" and replace with -- heatsink --.

Column 11,
Line 67, delete "be effective" and replace with -- be an effective --.

Column 13,
Line 5, delete "core material 115a" and replace with -- core material 115 --.

UNITED STATES PATENT AND TRADEMARK OFFICE
CERTIFICATE OF CORRECTION

PATENT NO. : 6,339,875
DATED : January 22, 2002
INVENTOR(S) : Larson

It is certified that error appears in the above-identified patent and that said Letters Patent is hereby corrected as shown below:

Column 14,
Line 28, delete "heat sink" and replace with -- heatsink --.

Column 15,
Line 3, delete "comprising:" and replace with -- comprising the steps of: --.
Line 8, delete "circuit;" and replace with -- circuit; and --.

Signed and Sealed this

Fourteenth Day of May, 2002

*Attest:*

JAMES E. ROGAN
*Attesting Officer*     *Director of the United States Patent and Trademark Office*